United States Patent
Lee et al.

(10) Patent No.: US 8,053,879 B2
(45) Date of Patent: Nov. 8, 2011

(54) STACKED SEMICONDUCTOR PACKAGE AND METHOD FOR FABRICATING THE SAME

(75) Inventors: Woong Sun Lee, Gyeonggi-do (KR); Qwan Ho Chung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/261,223

(22) Filed: Oct. 30, 2008

(65) Prior Publication Data

US 2010/0052187 A1 Mar. 4, 2010

(30) Foreign Application Priority Data

Sep. 1, 2008 (KR) .................. 10-2008-0085890

(51) Int. Cl.
*H01L 23/02* (2006.01)
(52) U.S. Cl. ........................... 257/686; 257/777
(58) Field of Classification Search .................. 257/686, 257/777, 723, 724
See application file for complete search history.

(56) References Cited

U.S. PATENT DOCUMENTS

| | | | | |
|---|---|---|---|---|
| 6,188,127 B1 * | 2/2001 | Senba et al. | | 257/686 |
| 6,239,496 B1 * | 5/2001 | Asada | | 257/777 |
| 6,303,997 B1 * | 10/2001 | Lee | | 257/778 |
| 6,469,374 B1 * | 10/2002 | Imoto | | 257/686 |
| 6,501,165 B1 * | 12/2002 | Farnworth et al. | | 257/686 |
| 6,960,827 B2 * | 11/2005 | Nishimura et al. | | 257/723 |
| 7,656,017 B2 * | 2/2010 | Kim et al. | | 257/686 |
| 7,663,215 B2 * | 2/2010 | Tuominen et al. | | 257/686 |
| 2007/0145563 A1 | 6/2007 | Punzalan et al. | | |

FOREIGN PATENT DOCUMENTS

| | | |
|---|---|---|
| JP | 2002-246536 A | 8/2002 |
| JP | 2007-053327 A | 3/2007 |
| KR | 10-0321159 B1 | 3/2002 |
| KR | 10-0415281 B1 | 1/2004 |
| KR | 10-0650769 B1 | 11/2006 |

* cited by examiner

Primary Examiner — S. V. Clark
(74) Attorney, Agent, or Firm — Ladas & Parry LLP

(57) ABSTRACT

A stacked semiconductor package having a unit package, cover substrates, adhesive members and connection electrodes is presented. The unit package includes a substrate, a first circuit pattern and a second circuit pattern. The first circuit pattern is disposed over an upper face of the substrate. The second circuit pattern is disposed over a lower face of the substrate. The lower and upper faces of the substrate oppose each other. The first and second semiconductor chips are respectively electrically connected to the first and second circuit patterns. The cover substrates are opposed to the first semiconductor chip and the second semiconductor chip. The adhesive members are respectively interposed between the unit package and the cover substrates. The connection electrodes pass through the unit package, the cover substrates and the adhesive members and are electrically connected to the first and second circuit patterns.

5 Claims, 5 Drawing Sheets

STACKED SEMICONDUCTOR PACKAGE AND METHOD FOR FABRICATING THE SAME

CROSS-REFERENCE TO RELATED APPLICATIONS

The present application claims priority to Korean patent application number 10-2008-0085890 filed on Sep. 1, 2008, which is incorporated herein by reference in its entirety.

BACKGROUND OF THE INVENTION

The present invention relates generally to semiconductor fabrication, and more particularly to a stacked semiconductor package and a method for fabricating the same.

Recently there have been a number of advancements in developing semiconductor chips that are capable of storing massive amounts of data and processing these massive amounts of data within relatively short periods of time.

In general, semiconductor packages are fabricated using a die sorting process, a die attach process, a wire bonding process and a molding process. The die sorting process is used to inspect semiconductor chips. The die attach process is used to mount good semiconductor chips onto printed circuit boards. The wire bonding process is used to electrically connect together the semiconductor chips to the substrate by using conductive wires. The molding process is used to mold the semiconductor chip with a molding member such as an epoxy resin molding member.

Recently, there has also been a number of advancements in developing stacked semiconductor packages. Stacked semiconductor packages are those that have a plurality of semiconductor packages stacked on top of each other. However, a problem occurs when fabricating these stacked semiconductor packages. In particular, when using the semiconductor package molded by a molding member, the number of steps and the complexity of the fabrication process of fabricating these semiconductor packages increases.

Furthermore, another problem arises when electrically connecting the substrate and the respective semiconductor chips together. In particular, when using conductive wires after the semiconductor chips are stacked onto the substrate, it is difficult to design a wiring scheme to operate the semiconductor chips at acceptable high speeds. One encumbrance is that the lengths of the conductive wires connected with the respective semiconductor chips are different.

SUMMARY OF THE INVENTION

Embodiments of the present invention are directed to semiconductor packages made from significantly reduced fabrication process steps and which are suitable to operate at high speeds.

Embodiments of the present invention are also directed to fabrication methods for fabricating these semiconductor packages.

One embodiment of a semiconductor package comprises a unit package, cover substrates, adhesive members, and connection electrodes. The unit package includes a substrate, and first and second semiconductor chips. The substrate has a first circuit pattern disposed over an upper face of the substrate and a second circuit pattern disposed over a lower face of the substrate in which the lower face is opposed to the upper face. The first and second semiconductor chips are respectively electrically connected to the first and second circuit patterns. The cover substrates are opposed to the first semiconductor chip and the second semiconductor chip. The adhesive members are respectively interposed between the unit package and the cover substrates. The connection electrodes pass through the unit package, the cover substrates and the adhesive members and are electrically connected to the first and second circuit patterns.

The first semiconductor chip includes a first bump electrically connected with the first circuit pattern. The second semiconductor chip includes a second bump electrically connected with the second circuit pattern.

The semiconductor package may further comprise a first conductive wire and a second conductive wire. The first conductive wire is used to electrically connect the first semiconductor chip to the first circuit pattern. The second conductive wire is used to electrically connect the second semiconductor chip to the second circuit pattern.

One embodiment of the connection electrode is that it may have a pin shape.

Another embodiment of the connection electrode is that it may include a pin.

The semiconductor package may further comprise a connection member electrically connected to an end portion of the connection electrode.

The number of the unit packages must be at least two, in which each pair of adjacent stacked unit packages has an adhesive member interposed there between.

The adhesive member may be any commercially available adhesive member such as those selected from the group consisting of thermosetting resins and a thermoplastic resins.

The semiconductor package may further comprise a third circuit pattern and a third semiconductor chip. The third circuit pattern may be disposed over an inside face of the cover substrates and may be electrically connected to the connection electrode. The third semiconductor chip may be electrically connected to the third circuit pattern.

In another embodiment, a method for fabricating a semiconductor package comprises a first electrically connecting step; a second electrically connecting step; a covering step; a disposing step; and a forming step. The first step of electrically connecting comprises electrically connecting the first semiconductor chip to the first circuit pattern formed in respective first chip regions included in respective first chip groups formed over a first face of a mother substrate. The second step of electrically connecting comprises electrically connecting a second semiconductor chip to a second circuit pattern formed in respective second chip regions included in respective second chip groups formed over a second face of a mother substrate. The step of covering comprises covering the first and second semiconductor chips by disposing adhesive members over the first and second faces. The step of disposing comprises disposing cover substrates respectively covering the adhesive members disposed over the first and second faces. The step of forming comprises forming a connection electrode passing through the mother substrate and the cover substrates and electrically connecting the first and second circuit patterns.

The first semiconductor chip and the first circuit pattern are electrically connected together using first bumps formed in the first semiconductor chip. The second semiconductor chip and the second circuit pattern are electrically connected together using second bumps formed in the second semiconductor chip.

The first semiconductor chip and the first circuit pattern are electrically connected together using a first conductive wire. The second semiconductor chip and the second circuit pattern are electrically connected together using a second conductive wire.

At least two mother substrates are stacked on each other.

The first and second chip groups are formed over the mother substrate in a matrix shape, and the first and second chip groups are formed at the same position in the mother substrate.

The method may further comprise, after the step of forming the connection electrode, the step of electrically connecting a connection member to the connection electrode exposed from one of the cover substrates.

The method may further comprise the step of forming a wiring over the cover substrate to electrically connect the connection electrode to the connection member.

The method may further comprise the step of applying heat and pressure to the adhesive members. The step of apply heat and pressure is performed after the step of disposing the cover substrates over the adhesive members.

The method may further comprise the steps of forming a third circuit pattern; mounting a third semiconductor chip; and connecting the third circuit pattern. All of these steps are performed before the step of disposing the cover substrates over the adhesive members. The step of forming a third circuit pattern comprises forming the third circuit pattern aligned with the first and second circuit patterns over one face of the at least one cover substrate. The step of mounting a third semiconductor chip comprises mounting the third semiconductor chip onto the third circuit pattern. The step of connecting the third circuit pattern comprises connecting the third circuit pattern to the connection electrode during the step of forming the connection electrode.

The method may further comprise the steps of removing and disposing. The steps of removing and disposing are performed before the step of electrically connecting the first semiconductor chip to the first circuit pattern.

The step of removing comprises removing the first chip region determined to be faulty of the first chip regions from the mother substrate. The step of disposing comprises disposing a good substrate to the removed first chip region.

In another embodiment of the present invention, a method for fabricating a semiconductor package comprises the steps of disposing a substrate; disposing adhesive members; disposing a cover substrate; and forming a connection electrode. The step of disposing a substrate comprises disposing a substrate into a plurality of openings formed in a mother substrate in which semiconductor chips are mounted on circuit patterns respectively disposed in a plurality of chip regions. The step of disposing adhesive members comprises disposing adhesive members opposed to the respective semiconductor chips over the mother substrate. The step of disposing a cover substrate comprises disposing a cover substrate opposed to the semiconductor chip over the adhesive member. The step of forming a connection electrode comprises forming a connection electrode passing through the cover substrate, the mother substrate and electrically connected with the circuit pattern.

The circuit pattern and the semiconductor chip are electrically connected together with a conductive wire.

At least two mother substrates are stacked on each other.

The method may further comprise the step of applying heat and pressure to the adhesive member, after disposing the cover substrate over the adhesive member.

DESCRIPTION OF SPECIFIC EMBODIMENTS

Figure 1:
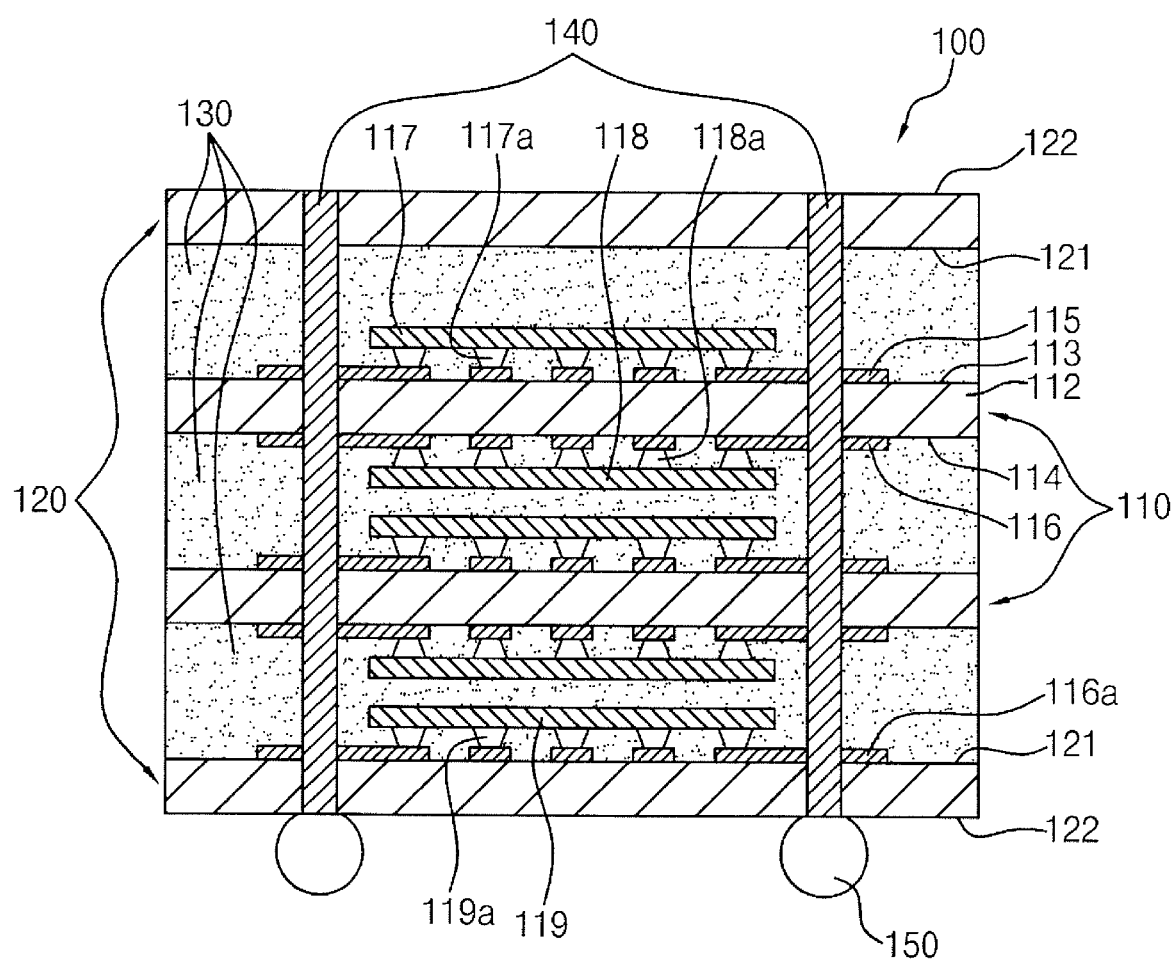
FIG. 1 is a cross-sectional view showing a semiconductor package in accordance with an embodiment of the present invention.

FIG. 1 is a cross-sectional view showing a semiconductor package in accordance with an embodiment of the present invention.

Referring to FIG. 1, a semiconductor package 100 includes unit packages 110, cover substrates 120, adhesive members 130 and connection electrodes 140.

Each unit package 110 includes a substrate 112, a first semiconductor chip 117 and a second semiconductor chip 118. In the present embodiment, the number of the unit package 110 is at least one. In the present illustrated exemplary embodiment, the number of the unit package 110 is, for example, two.

The substrate 112 may be a printed circuit board (PCB) having a plate shape. The PCB having a plate shape has an upper face 113 and a lower face 114 opposed to the upper face 113.

The substrate 112 has a first circuit pattern 115 and a second circuit pattern 116. The first circuit pattern 115 is disposed over the upper face 113 of the substrate 112 and the second circuit pattern 116 is disposed over the lower face 114 of the substrate 112.

In the presently illustrated embodiment, the first circuit pattern 115 and the second circuit pattern 116 have, for example, the same shape and the same size, and the first circuit pattern 115 and the second circuit pattern 116 are opposed to each other. Alternatively, the first circuit pattern 115 and the second circuit pattern 116 may have different shapes and different sizes, and only some portions of the first circuit pattern 115 and the second circuit pattern 116 may be opposed to each other.

The first semiconductor chip 117 is disposed, for example, over an upper face 113 of the substrate 112, and the first semiconductor chip 117 is electrically connected to the first circuit pattern 115.

The first semiconductor chip 117 has a bonding pad (not shown) and a first bump 117a connected to the bonding pad. The first bump 117a is electrically connected to the first circuit pattern 115. That is to say, in the present illustrated embodiment, the first semiconductor chip 117 is bonded to the first circuit pattern 115 via a flip-chip method.

The second semiconductor chip 118 is disposed over the lower face 114 of the substrate 112 in which the second semiconductor chip 118 is electrically connected to the second circuit pattern 116. The second semiconductor chip 118 has a bonding pad (not shown) and has a second bump 118a connected to the bonding pad. The second bump 118a is electrically connected to the second circuit pattern 116. That is to say, in the present exemplary embodiment, the second semiconductor chip 118 is bonded to the second circuit pattern 116 via a flip-chip method.

Alternatively, the first and second semiconductor chips 117, 118 may be disposed so that the bonding pads thereof face upwardly. The bonding pad of the first semiconductor chip 117 and the first circuit pattern 115 and the bonding pad of the second semiconductor chip 118 and the second circuit pattern 116 may respectively be electrically connected to each other.

The cover substrates 120 are shown disposed at both sides of the unit package. Thus, the cover substrates 120 in this exemplary embodiment, face the first semiconductor chip 117 and second semiconductor chip 118 of the unit package 110, respectively.

In the present exemplary embodiment, the cover substrate 120 may be, for example, a PCB having a plate shape. The cover substrate 120 acts as a medium for protecting the unit package 110 from the external impact and/or vibration. The cover substrate 120 also acts to electrically connect an external device to the unit package 110.

At least one of the cover substrates 120 may further include a third circuit pattern 116a and a third semiconductor chip 119.

The third circuit pattern 116a is disposed, for example, over an inside face 121 of the cover substrate 120 that faces to the unit package 110. The third circuit pattern 116a may have substantially the same shape and size as the first and second circuit patterns 115, 116. The third circuit pattern 116a faces towards the first and second circuit patterns 115, 116.

The third semiconductor chip 119 includes a third bump 119a connected to a bonding pad (not shown). The third bump 116a is electrically connected to the third circuit pattern 116a.

By disposing the third circuit pattern 116a on the cover substrate 120 and by connecting the third semiconductor chip 119 to the third circuit pattern 116a, it is possible to enhance the data storing capacity and/or the data processing speed of the resultant semiconductor package 100.

The adhesive members 130 are disposed between each unit package 100 and between the cover substrates 120 which are disposed at both sides of the unit packages 100. When the number of the unit package 110 is at least two, the adhesive member 130 is also interposed between the unit packages 110.

The adhesive member 130 may be any commercially available adhesive. A preferred embodiment is that the adhesive member may be a thermosetting resin which can be subsequently hardened after being molten from heating. Alternatively, the adhesive member 130 may be a thermoplastic resin which can also be subsequently hardened after being molten from heat.

As shown, the adhesive member 130 may be filled between the first semiconductor chip 117 having the first bump 117a and the upper face 113 of the substrate 112 and between the second semiconductor chip 118 having the second bump 118a and the lower face 114 of the substrate 112.

In the present embodiment, when adhering together the unit packages 110 and the cover substrates 120 at the same time with the adhesive member 130, it is possible to reduce the entire fabricating process steps of the semiconductor package by about 30% as compared to a similar process of stacking after forming respectively a molding member to the unit packages 110.

As shown, the connection electrodes 140 pass through the unit package 110, the cover substrates 120 and the adhesive members. One preferred embodiment is that the connection electrode 140 has a pin shape, and the connection electrode 140 is electrically connected to the first circuit pattern 115 and to the second circuit pattern 116. Alternatively, another preferred embodiment is that the connection electrode 140 may be a conductive pin.

In the present exemplary embodiment, the connection electrode 140 may preferably include copper, copper alloy, aluminum and aluminum alloy. All of which have excellent conductive properties.

Meanwhile, the semiconductor package 100 in accordance to the present exemplary embodiment may further include a connection member 150. The connection member 150 may be electrically connected to the connection electrode 140 exposed from one of the cover substrates 120. One preferred embodiment is that the connection member 150 may be, for example, a conductive ball. The conductive ball may include, for example, a solder having a low melting temperature. In the present embodiment, the cover substrate 120 may include a wiring (not shown) formed in an outside face 122 opposed to the inside face 121, and the connection member 150 may be electrically connected with the wiring.

FIGS. 2 through 5 depict a top plan view and cross-sectional views illustrating a method for fabricating the semiconductor package shown in FIG. 1.

Figure 2:
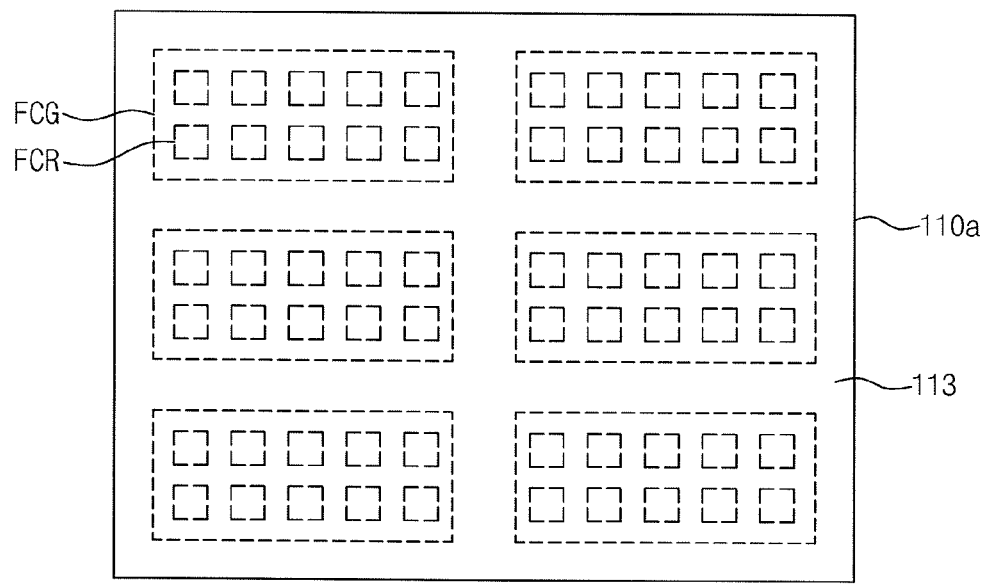
FIGS. 2 through 5 are a plan view and cross-sectional views shown for illustrating a method for fabricating the semiconductor package shown in FIG. 1.

Referring to FIGS. 1 and 2, in order to fabricate a semiconductor package, a die process is used to attach the first semiconductor chip 117 and the second semiconductor chip 118 onto a mother substrate 110a.

The mother substrate, on which the first and second semiconductor chips 117, 118 are die attached, has preferably a plate shape. The mother substrate 110a may for example be a PCB. The mother substrate 110a can have a plate shape that includes a first face 113 and a second face opposed to the first face 113.

A size of the mother substrate 110a may be any size, for example, 40 cm×40 cm in width by length. In the present exemplary embodiment of the mother substrate 110a, a first chip groups (FCG) having a plurality of first chip regions (FCR) is arranged in the first face 113 of the mother substrate 110a.

In the present embodiment, the plurality of first chip groups FCG is arranged in a type of matrix shape over the first face 113 of the mother substrate 110a. The first chip regions FCR of each first chip group FCG are also arranged in a type of matrix shape within the boundaries of their respective first chip groups FCG.

Figure 3:
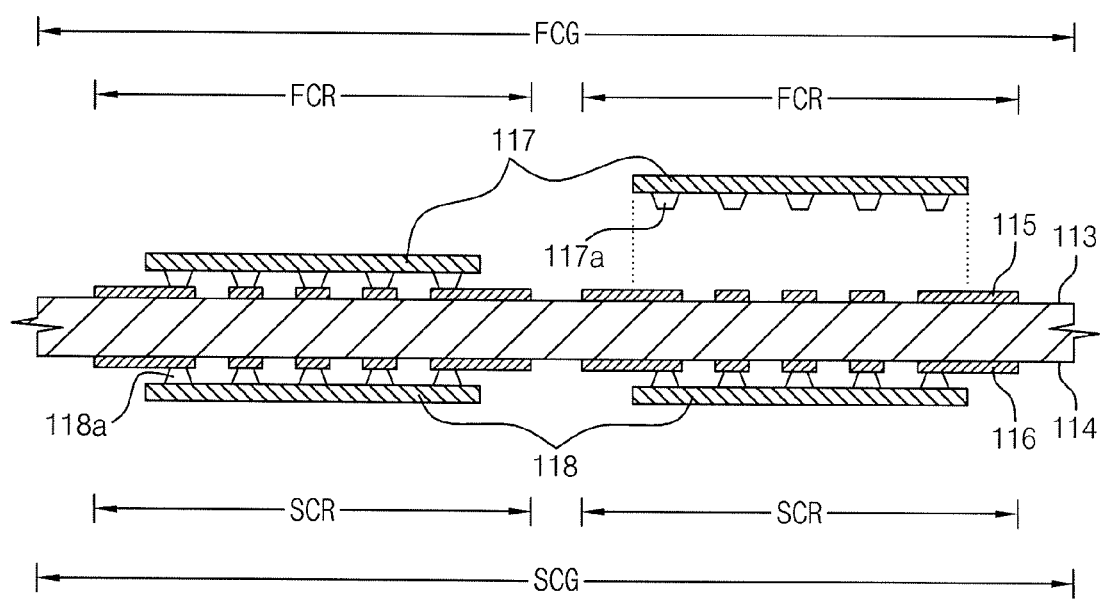

As shown in FIG. 3, the first circuit pattern 115 is formed in the respective first chip regions FCR and is shown arranged inside of the respective first chip group FCG.

The second chip groups SCG are arranged in a matrix type of shape over the second face 114 of the mother substrate 110a. The second chip regions SCR are also shown arranged in a matrix type of shape inside of the respective second chip groups SCG.

As shown in FIG. 3, the second circuit pattern 115 is formed in the respective second chip regions SCR arranged within of the respective second chip groups SCG.

In the present exemplary embodiment, the first chip groups FCG and the second chip groups SCG are shown opposed to each other. The first chip regions are shown included in the respective first chip groups FCG and the second chip regions SGR are shown included in the respective second chip groups SCG. The first chip groups FCG and the second chip groups SCG are shown opposed to each other. The first circuit patterns 115 are shown in their respective first chip regions FCR. Likewise the second circuit patterns 116 are shown in their respective second chip regions SCR. The first circuit patterns 115 and the second circuit patterns 116 are shown having substantially the same shape and the same size. The first circuit patterns 115 and the second circuit patterns 116 are also shown opposed to each other.

Meanwhile, during the process of fabricating the mother substrate 110a, a fault can occur in the first circuit pattern 115 formed in the respective first chip regions FCR included in the first chip group FCG or can occur in the second circuit pattern 116 formed in the respective second chip regions SCR included in the second chip group SCG.

In the present embodiment, the first circuit patterns 115 in the respective first chip regions FCR and the second circuit pattern 116 in the respective second chip regions SCR of the mother substrate 110a can be inspected to diagnose a faulty first circuit pattern 115 and/or a faulty second circuit pattern 116.

After determining that first circuit pattern 115 and/or the second circuit pattern 116 are faulty, the portion corresponding to the first and second chip regions FCR, SCR having the faulty first and second circuit patterns 115, 116 can be removed from the mother substrate 110a. Thus at least one opening is formed in the mother substrate 110a corresponding to the first and second chip regions FCR, SCR having the faulty first and second circuit patterns 115, 116.

A good substrate having a good first circuit pattern and good second circuit pattern is disposed in the respective openings of the mother substrate 110a. The good substrate has substantially the same shape and size as the first and second chip regions FCR, SCR.

Meanwhile, during the process of fabricating the mother substrate 110a, a fault may arise in the first circuit patterns 115 formed in most of the respective first chip regions FCR included in the first chip group FCG or may arise in the second circuit pattern 116 formed in the respective second chip regions SCR included in the second chip group SCG.

In the present embodiment, the first circuit patterns 115 in the respective first chip regions FCR and the second circuit pattern 116 in the respective second chip regions SCR of the mother substrate 110a can be inspected and thus any of the first and second chip regions FCR, SCR having faulty first or second circuit patterns can be identified.

When first and second circuit patterns 115, 116 formed in the first and second chip regions FCR, SCR included in the first chip group FCG and the second chip group SCG are found to be faulty, then that portion corresponding to the first and second chip groups FCG, SCG can be removed from the mother substrate 110a and thus an opening is formed in the mother substrate 110a. The opening has the same shape and size as the first and second chip groups FCG, SCG.

Accordingly, implementing this quality assurance/quality control (QA/QC) correction technique, a good substrate having a good first circuit pattern and a good second circuit pattern is more likely to be disposed in the respective openings of the mother substrate 110a.

Referring to FIG. 3, the first semiconductor chip 117 formed with the first bump 117a is connected with the first circuit pattern 115 in the first chip region FCR using a flip chip method. Alternatively, the first semiconductor chip 117 and the first circuit patter 115 may be electrically connected to a conductive wire.

The second semiconductor chip 118 formed with the second bump 118a is connected with the second circuit pattern 116 in the second chip region SCR using a flip chip method. Alternatively, the second semiconductor chip 118 and the second circuit patter 116 may be electrically connected to a conductive wire.

One preferred embodiment is that the first semiconductor chip 117 is die attached onto the first circuit pattern 115 in the first chip region FCR of the mother substrate 110a. The second semiconductor chip 118 may also be die attached onto the second circuit pattern 116 in the second chip region SCR.

Figure 4:
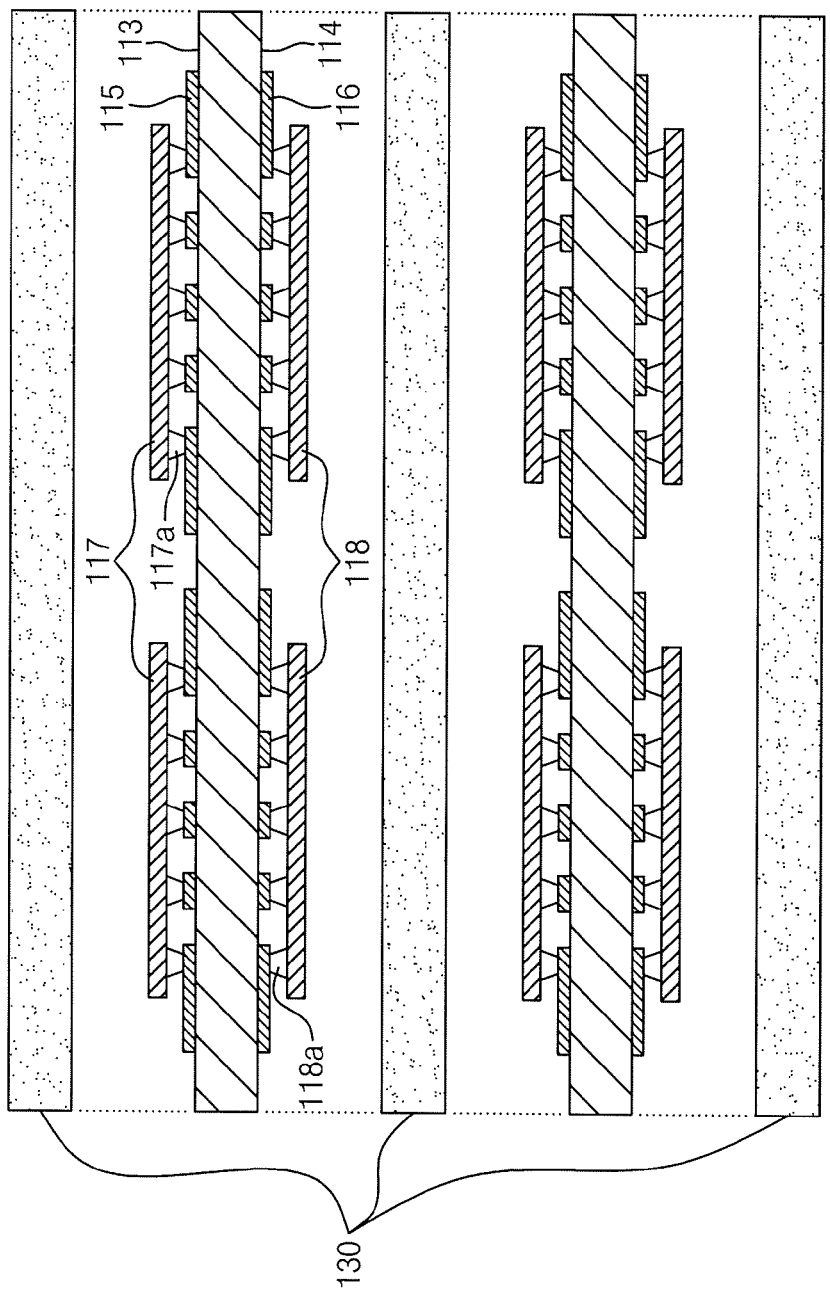

One preferred embodiment, as shown in FIG. 4, the adhesive members 130 have plate shapes which are then disposed over the first face 113 and second face 114 of the mother substrate 110a. As a result, the first and second semiconductor chips 117, 118 can be substantially covered by the adhesive members 130.

In the present exemplary embodiment, the adhesive member 130 may include a thermosetting resin which is subsequently hardened after being melted from exposure to heat and pressure. In the present embodiment, the adhesive member may be a prepreg. In this present embodiment, the prepreg may include glass fibers and a thermosetting resin permeated therein. Alternatively, the adhesive member may include a thermoplastic resin that can be melted by heat.

In the present embodiment, at least two mother substrates 110a on which the first and second semiconductor chips 117, 118 are die attached may be stacked on each other. The adhesive member 130 is interposed between the mother substrates 110a when at least two mother substrates 110a are stacked together.

After the adhesive members 130 are disposed at both sides of the mother substrate 110a, cover substrates 120 can be respectively disposed on the exposed outer surfaces of the adhesive members 130.

In the present embodiment, a third circuit pattern 116a may be formed over the inside face 121 of the cover substrate 120 which is opposed to the mother substrate 110a. The third circuit pattern 116a has substantially the same shape and same size as that of the first and second circuit patterns 115, 116, and the third circuit pattern 116a is opposed to the first and second circuit patterns 115, 116

The third bump 119a formed in the third semiconductor chip 119 is connected to the third circuit pattern 116a via a flip chip method.

After the cover substrates 120 are respectively disposed over the adhesive members 130, a temperature of about 200° C. and a pressure of about 30 ton/unit area are applied to the respective adhesive members 130. As a result, the adhesive members 130 are melted and the cover substrates 120 and the mother substrate 110a are subsequently attached to each other by using the molten adhesive member 130. Also, while the adhesive members 130 are molten, the molten adhesive members 130 are provided between the first face 113 of the mother substrate 110a and the first semiconductor chip 117 and the second face 114 of the mother substrate 110a and the second semiconductor chip 118.

Figure 5:
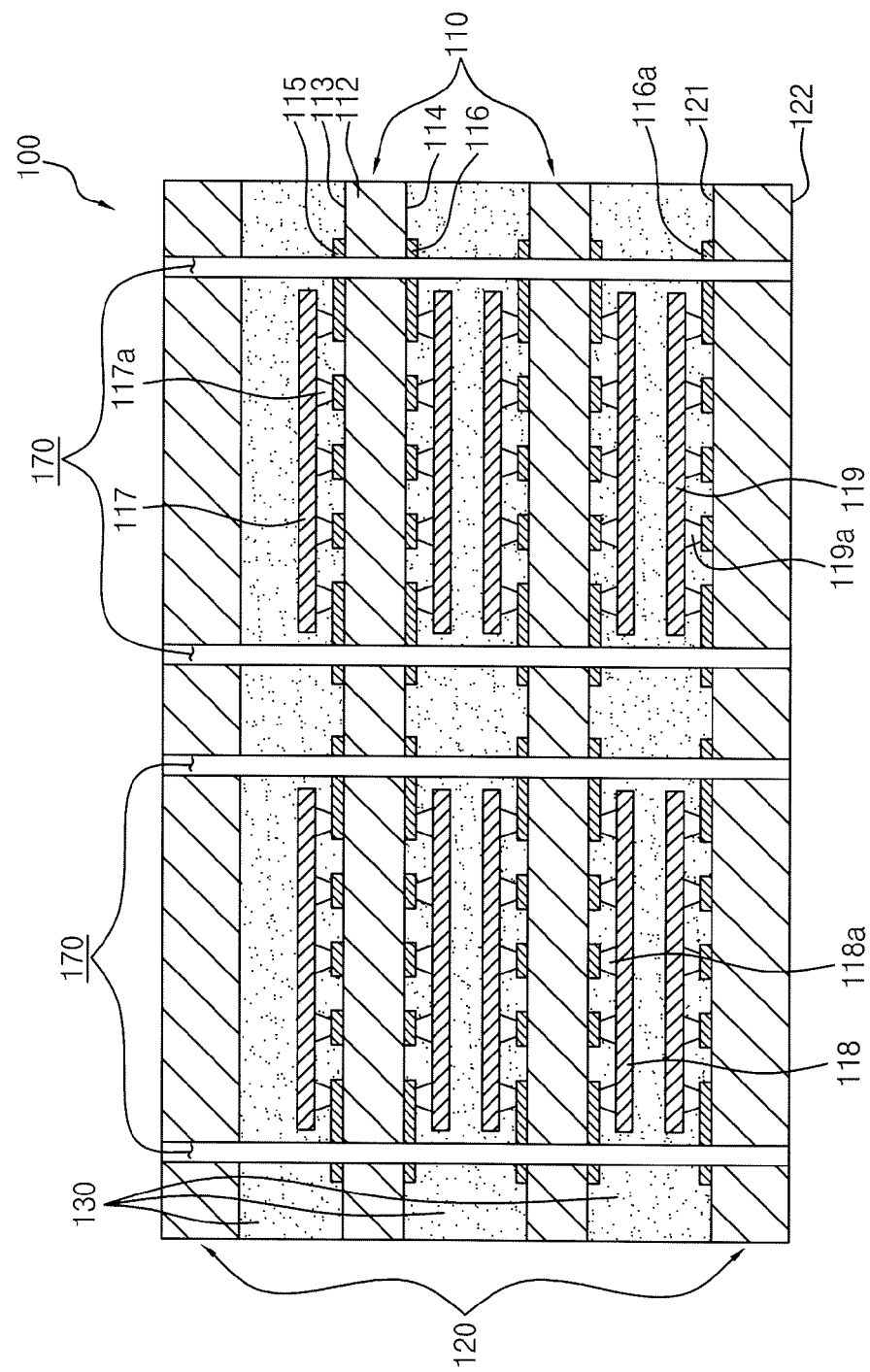

Referring to FIG. 5, through holes 170 are formed through the cover substrates 120, the adhesive members 130 and the mother substrate 110a. In the present embodiment, the through holes 170 pass through the first circuit pattern 115 and the second circuit pattern 116 and the third circuit pattern 116a corresponding to the first circuit pattern 115. In the present embodiment, the through holes 170 may be formed, for example, by using a drilling process or by using a laser drilling process.

Referring again to FIG. 1, after the through holes 170 are formed through the cover substrates 120, the adhesive members 130 and the mother substrate 110a, then the connection electrode 140 is formed by disposing conductive material in the inside of the through holes 170.

The connection electrode 140 is formed, for example, by a plating process and thus the connection electrode 140 may have a pin shape. Alternatively, the connection electrode 140 may be formed by disposing conductive pins directly inside the through holes 170.

Subsequently, the mother substrate 110a, the cover substrates 120 and the adhesive members 130 are then singulated by using a cutting process. Afterwards a conductive ball, including a low melting point metal such as a solder, is then electrically connected to the respective connection electrodes 140 exposed from the respective singulated cover substrates 120. Accordingly, the semiconductor package 100 is fabricated as shown in FIG. 1.

Figure 6:
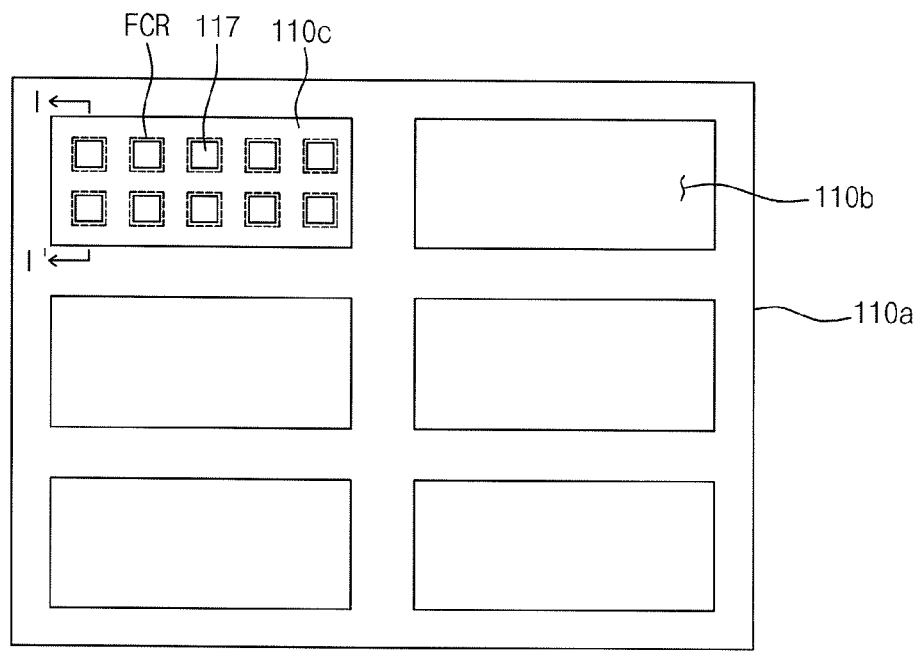
FIGS. 6 and 7 are a plan view and a cross-sectional view shown for illustrating another example of a method for fabricating the semiconductor package shown in FIG. 1.
Figure 7:
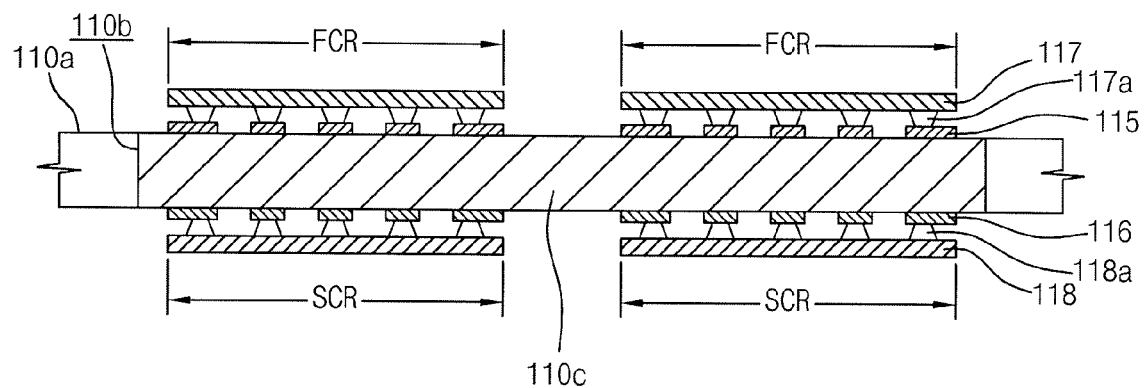

FIGS. 6 and 7 depict a plan view and a cross-sectional view illustrating yet another example of a method for fabricating the semiconductor package shown in FIG. 1.

Referring to FIGS. 6 and 7, in order to fabricate a semiconductor package, a process of forming openings 110b in the mother substrate 110a is first performed. The openings 110b are arranged, for example, in a type of an ordered matrix shape over the mother substrate 110a. The opening 110b may have, for example, rectangular shapes.

A sub-substrate 110c is disposed in the respective openings 110b in the mother substrate 110a. The sub-substrate 110c may be inserted in the mother substrate 110a or adhered to the mother substrate 110a.

Referring to FIGS. 6 and 7, a plurality of first chip regions FCR is shown arranged over an upper face of the sub-substrate 110c and a plurality of second chip regions SCR is shown arranged over a lower face opposed to the upper face of the sub-substrate 110c. The first chip regions FCR are shown arranged in a matrix shape over the upper face of the sub-substrate 110c. The second chip regions SCR are shown arranged in a matrix shape over the lower face of the sub-substrate 110c. The first and second chip regions FCR, SCR are shown opposed to each other.

The first circuit pattern 115 is shown disposed in the respective first chip regions FCR, and the second circuit pattern 116 is shown disposed in the respective second chip regions SCR. The first and second circuit patterns 115, 116 are shown to have substantially the same shape and same size, and at least some of the first and second circuit patterns 115, 116 are shown to be opposed to each other.

The first semiconductor chip 117 is shown having first bumps 117a disposed in the first circuit pattern 115 in the first chip region FCR of the sub-substrate 110c. The second semiconductor chip 118 is shown having second bumps 118a disposed in the second circuit pattern 116 in the second chip region SCR of the sub-substrate 110c.

The first bumps 117a are electrically connected to the first circuit pattern 115, and the second bump 118a are electrically connected to the second circuit pattern 115.

Referring to FIG. 5, through holes 170 are formed in the cover substrates 120, the adhesive members 130 and the mother substrate 110a having the sub-substrate 110b. In the present embodiment, the through holes 170 pass through the first circuit pattern 115 and the second circuit pattern 116 and the third circuit pattern 116a corresponding to the first circuit pattern 115. In the present embodiment, the through holes 170 may be formed, for example, by using a drilling process or by using a laser drilling process.

Referring again to FIG. 1, after the through holes 170 are formed through the cover substrates 120, the adhesive members 130 and the mother substrate 110a, then the connection electrodes 140 are formed by disposing conductive material inside of the through holes 170.

The connection electrode 140 may be formed, for example, by using a plating process and thereby the connection electrodes 140 may have a pin shape. Alternatively, the connection electrode 140 may be formed by disposing conductive pins directly inside of the through holes 170.

Subsequently, the mother substrate 110a, the cover substrates 120 and the adhesive members 130 are singulated by a cutting process. Then a conductive ball including a low melting point metal such as a solder is connected to the respective connection electrodes 140 which are exposed from the respective singulated cover substrates 120. Accordingly, the semiconductor package 100 is fabricated as shown in FIG. 1.

As is apparent from the above description, in the present embodiments, by die attaching semiconductor chips to a plurality of mother substrates, it is possible to reduce the number of process steps needed to fabricate the stacked semiconductor package. It should also be apparent that the semiconductor package can be used as a substrate for an external electronic device.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor package, comprising:
  a unit package comprising:
    a substrate,
    a first circuit pattern disposed over an upper face of the substrate,
    a second circuit pattern disposed over a lower face of the substrate wherein the lower face is opposed to the upper face, and
    first and second semiconductor chips respectively electrically connected to the first and second circuit patterns;
  cover substrates opposed to the first semiconductor chip and the second semiconductor chip;
  a unitary adhesive member being fully filled between the first and second circuit patterns and the first and second semiconductor chips and between the unit package and the cover substrate, respectively; and
  connection electrodes passing through the unit package, the cover substrates and the adhesive members such that the connection electrodes electrically connect together the first and second circuit patterns.

2. The semiconductor package according to claim 1, further comprising: a connection member electrically connected to an end portion of the connection electrode.

3. The semiconductor package according to claim 1, wherein a number of the unit package is at least two, and one of the adhesive members is interposed between each adjacent unit package pair.

4. The semiconductor package according to claim 1, wherein the adhesive member is selected from the group consisting of a thermosetting resin and a thermoplastic resin.

5. The semiconductor package according to claim 1, further comprising: a third circuit pattern disposed over an inside face of the cover substrates and electrically connected to the connection electrodes; and a third semiconductor chip electrically connected to the third circuit pattern.

* * * * *